United States Patent [19]
Nojiri

[11] Patent Number: 6,014,060
[45] Date of Patent: Jan. 11, 2000

[54] VOLTAGE SUPPLY CIRCUIT FOR AMPLIFIER

[75] Inventor: Kazuhiko Nojiri, Tokorozawa, Japan

[73] Assignee: Pioneer Electronic Corporation, Tokyo, Japan

[21] Appl. No.: 09/083,443

[22] Filed: May 22, 1998

[30]     Foreign Application Priority Data

May 26, 1997   [JP]   Japan .................................. 9-135512

[51] Int. Cl.[7] ...................................................... H03F 3/04
[52] U.S. Cl. ............................................................ 330/297
[58] Field of Search ............................ 323/314; 330/127, 330/297, 300

[56]            References Cited

U.S. PATENT DOCUMENTS 4,423,389  12/1983  Fushiki .................................. 330/297
4,433,307   2/1984  Yokoyama ............................. 330/297
4,472,688   9/1984  Saburo et al. ......................... 330/297
4,520,322   5/1985  Ishii ................................... 330/297 X
5,818,301  10/1998  Higashiyama et al. ............. 330/297 X Primary Examiner—Steven J. Mottola
Attorney, Agent, or Firm—Morgan, Lewis & Bockius LLP

[57]            ABSTRACT

A voltage supply circuit for an amplifier which can limit an increase in supplying voltage even if the current supplied to the amplifier fluctuates. The voltage supply circuit receives high and low two voltages that are generated from a power source circuit and are in a relation of high and low levels. Either one of the high voltage and the low voltage is selectively supplied as the power voltage to the amplifier in accordance with the level of the signal outputted from the amplifier. The level of the high voltage is limited to a predetermined magnitude or less when the high voltage is supplied to the amplifier.

9 Claims, 5 Drawing Sheets

FIG.2B ON/OFF OF FET 1

FIG.2D ON/OFF OF TRANSISTOR 2

OUTPUT VOLTAGE
OF AMPLIFIER $e_0$

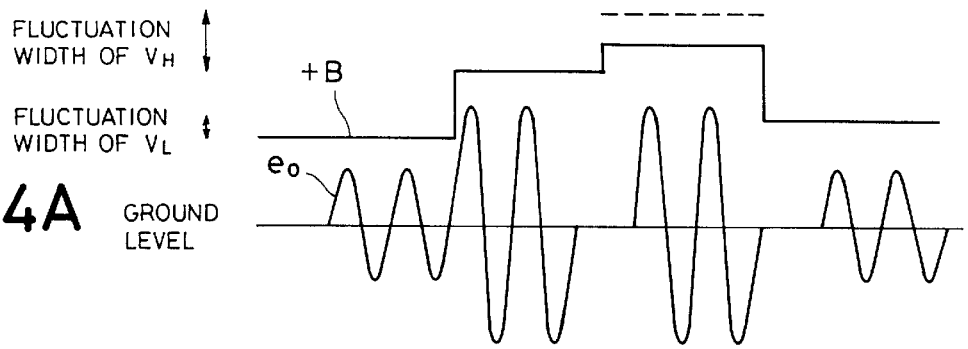
FIG.4A
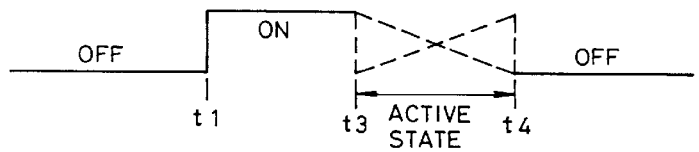
FIG.4B
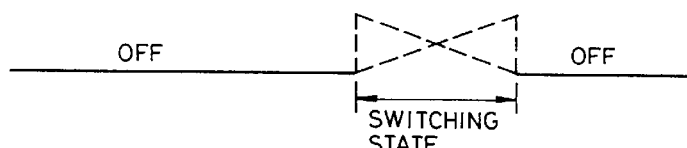
FIG.4C
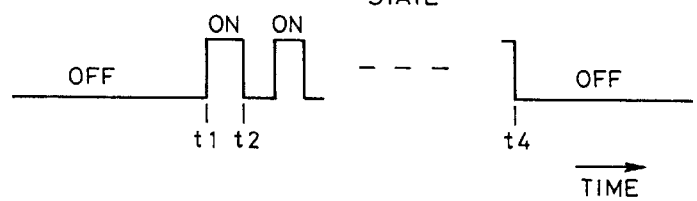
FIG.4D
FIG.4E

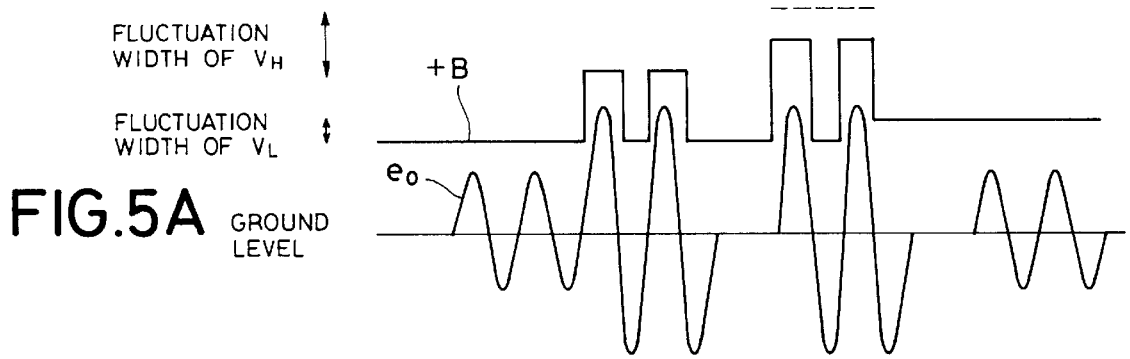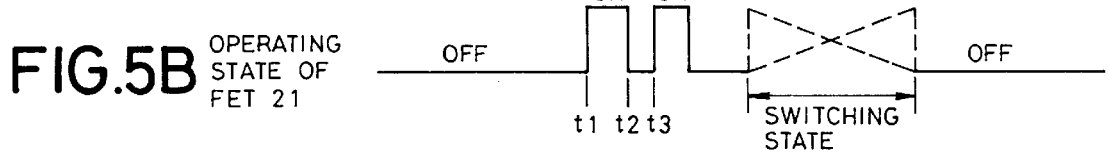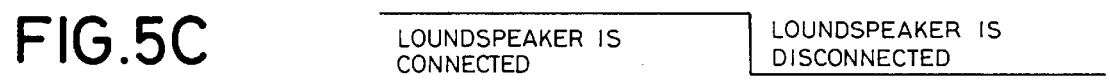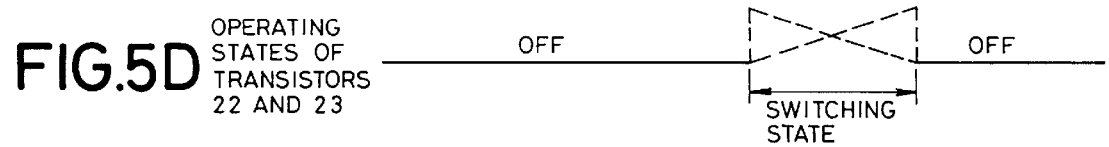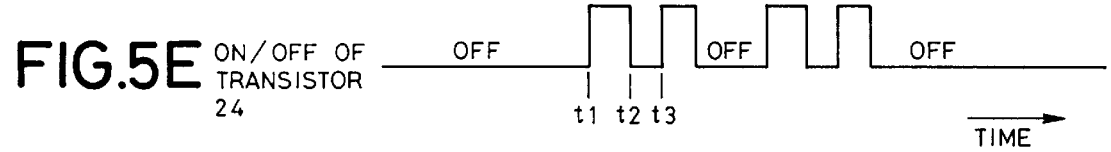

6,014,060

VOLTAGE SUPPLY CIRCUIT FOR AMPLIFIER

BACKGROUND OF THE INVENTION

1. Field of the Invention

The present invention relates to a voltage supply circuit for efficiently supplying a power voltage to an amplifier.

2. Description of Related Art

There is a known voltage supply circuit of high efficiency that is designed to switch a power voltage supplied to an amplifier between a low voltage $V_L$ and a high voltage $V_H$ in accordance with the level of the amplifier's output signal. If the level of the output signal of the amplifier goes up to exceed a predetermined threshold value when the low voltage $V_L$ is supplied as the power voltage, the high efficiency voltage supply circuit switches the power voltage supplied to the amplifier from the low voltage $V_L$ to the high voltage $V_H$. Conversely, if the level of the output signal of the amplifier falls below a predetermined threshold value when the high voltage $V_H$ is supplied, the circuit switches the power voltage from the high voltage $V_H$ to the low voltage $V_L$.

Generally, a power circuit for generating the low voltage $V_L$ and high voltage $V_H$ for the amplifier does not generate precisely stabilized voltages. The level of the power voltage fluctuates in each of the low voltage $V_L$ and high voltage $V_H$ in accordance with the magnitude of current supplied to the amplifier, because of an influence of the internal resistance of the power source circuit. In an extreme case, if a loudspeaker is disconnected from the amplifier when the high voltage $V_H$ is supplied, then a maximum voltage that is obtainable as the high voltage $V_H$ will be applied as the power voltage due to a decrease in the supply current. Therefore, it is necessary to use electric parts of the amplifier such as a capacitor or the like, which have a relatively high withstanding voltage.

SUMMARY AND OBJECTS OF THE INVENTION

It is, therefore, an object of the invention to provide a voltage supply circuit for an amplifier which can limit the rise of the supply voltage even when the current supplied to the amplifier fluctuates.

According to the invention, there is provided a voltage supply circuit for an amplifier for supplying a power voltage to the amplifier, comprising: means for receiving high and low two voltages which are outputted from a power source circuit and are in a relation of high and low levels; switching means for selectively supplying either one of the high and low voltages as the power voltage to the amplifier in accordance with a level of a signal generated from the amplifier; and limiting means for limiting the level of the high voltage to a predetermined magnitude or less when the high voltage is selected and supplied to the amplifier.

BRIEF DESCRIPTION OF THE DRAWINGS

FIGS. 2A, 2B, 2C and 2D are diagrams showing the operation of the voltage supply circuit shown in FIG. 1;

FIGS. 4A, 4B, 4C, 4D and 4E are diagrams showing the operation of the voltage supply circuit shown in FIG. 3; and FIGS. 5A, 5B, 5C, 5D and 5E are diagrams showing another operation of the voltage supply circuit in FIG. 3.

DETAILED DESCRIPTION OF THE PREFERRED EMBODIMENTS

An embodiment will now be described in detail hereinbelow with reference to the drawings.

Figure 1:
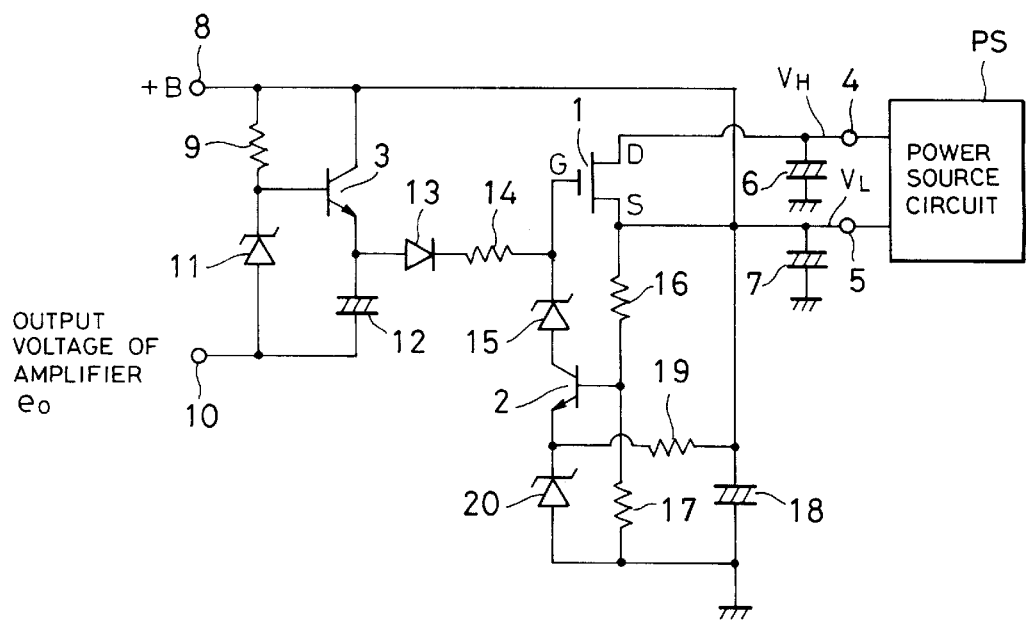
FIG. 1 is a circuit diagram showing an embodiment of the invention.

FIG. 1 shows a voltage supply circuit for an amplifier according to the invention. The high voltage $V_H$ and low voltage $V_L$ are supplied from a power source circuit PS to the voltage supply circuit. A power voltage +B is supplied from the voltage supply circuit to an amplifier (not shown). An output voltage of the amplifier is supplied to the power source circuit PS.

An FET (field effect transistor) 1 and two npn-type bipolar transistors 2 and 3 are provided for the voltage supply circuit. The high voltage $V_H$ is supplied to a drain D of the FET 1 via an input terminal 4. The low voltage $V_L$ is supplied to a source S of the FET 1 via an input terminal 5. Capacitors 6 and 7 are provided between the supplying lines and the ground. The source S of the FET 1 is connected to an output terminal 8 of the power voltage +B. A connecting line to the output terminal 8 of the power voltage +B is directly connected to a collector of the transistor 3 and is also connected to the base of the transistor 3 via a resistor 9.

A Zener diode 11 is inserted between an input terminal 10 for receiving the output voltage of the amplifier and the base of the transistor 3. That is, a cathode of the Zener diode 11 is connected to the base of the transistor 3 and an anode is connected to the input terminal 10. A capacitor 12 is inserted between the input terminal 10 and the emitter of the transistor 3. The transistor 3, resistor 9, Zener diode 11, and capacitor 12 construct a constant voltage circuit. When the power voltage +B is higher than a Zener voltage of the Zener diode 11, a voltage obtained by superimposing an output voltage of the amplifier to the Zener voltage is generated from the emitter of the transistor 3.

The emitter of the transistor 3 is connected to a diode 13 in the forward direction and is further connected to a gate of the FET 1 through a resistor 14. A Zener diode 15 is inserted between the gate of the FET 1 and a collector of the transistor 2 so that a cathode of the Zener diode 15 is connected to the gate side of the FET 1. A serial circuit of resistors 16 and 17 is inserted between the source of the FET 1 connected to the input terminal 5 of the low voltage $V_L$ and the ground. A connecting line between the resistors 16 and 17 is connected to the base of the transistor 2.

A capacitor 18 is inserted between the source of the FET 1 and the ground. A terminal of the capacitor 18 on the source side of the FET 1 is connected to the emitter of the transistor 2 through a resistor 19. A Zener diode 20 is inserted between the emitter of the transistor 2 and the ground so that a cathode of the diode 20 is connected to the emitter side of the transistor 2. The capacitor 18, resistor 19, and Zener diode 20 operate as a constant voltage circuit for supplying a Zener voltage of the Zener diode 20 to the emitter of the transistor 2.

In this voltage supply circuit, when the high voltage $V_H$ and low voltage $V_L$ are supplied from the power source circuit PS to the input terminals 4 and 5, the low voltage $V_L$ is transferred as a power voltage +B from the output terminal 8 to the amplifier. In the amplifier to which the power voltage +B was supplied, an amplifying operation to amplify an audio signal is executed. The amplified audio signal is supplied as an output voltage of the amplifier to the input terminal 10 of the voltage supply circuit.

A voltage is generated in the emitter of the transistor 3 by the source voltage +B and an output voltage $e_0$ of the amplifier which is supplied to the input terminal 10 is superimposed to the emitter voltage. When the source voltage +B is higher than a Zener voltage $V_{D11}$ of the Zener diode 11, the emitter voltage of the transistor 3 is equal to a addition voltage obtained by adding the Zener voltage $V_{D11}$ and the output voltage $e_0$ of the amplifier. The emitter voltage of the transistor 3 is supplied to the gate of the FET 1 through the diode 13 and resistor 14. The low voltage $V_L$ is applied to the source of the FET 1.

When the gate voltage of the FET 1 is higher than a voltage obtained by adding the low voltage $V_L$ and a voltage between the gate and source of the FET 1 because the output voltage $e_0$ of the amplifier rises, the FET 1 is turned on. Due to the turn-on of the FET 1, the high voltage $V_H$ from the power source circuit PS is transferred as a power voltage +B from the output terminal 8 to the amplifier via a portion between the drain and source of the FET 1.

As mentioned above, when the power voltage +B reaches the high voltage $V_H$, the high voltage $V_H$ is applied to a serial circuit of the resistors 16 and 17. A dividing voltage by the resistors 16 and 17 which is supplied to the base of the transistor 2 rises higher than the total voltage of a Zener voltage $V_{D20}$ of the Zener diode 20 and a voltage between the base and emitter of the transistor 2, so that the transistor 2 is turned on. Due to the turn-on of the transistor 2, the gate voltage of the FET 1 is limited to a value that is equal to or lower than the total voltage ($V_{D15}+V_{D20}$) of a Zener voltage $V_{D15}$ of the Zener diode 15 and the Zener voltage $V_{D20}$ of the Zener diode 20.

That is, even if the emitter voltage of the transistor 3 rises to a value that is equal to or higher than the total voltage ($V_{D15}+V_{D20}$) in accordance with the output voltage $e_0$ of the amplifier when the power voltage +B is the high voltage $V_H$, the gate voltage of the FET 1 is limited to the total voltage ($V_{D15}+V_{D20}$). At this time, therefore, the FET 1 is activated, an increase in voltage which is supplied from the gate of the FET 1 to the output terminal 8 is suppressed to a voltage lower than the maximum voltage which the high voltage $V_H$ can reach, and the suppressed voltage is supplied as a power voltage +B to the amplifier.

Figure 2A:
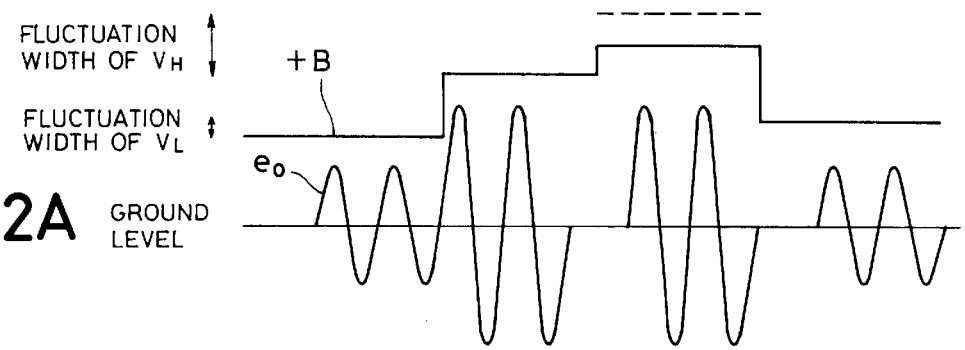
Figure 2C:
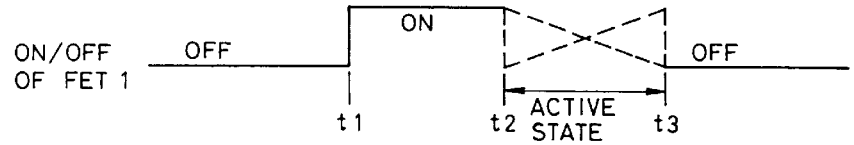
Figure 2C:

FIGS. 2A to 2D are diagrams showing the operation of the voltage supply circuit. FIG. 2A shows the relation between the output voltage $e_0$ of the amplifier and the power voltage +B. FIG. 2B shows an operating state of the FET 1. FIG. 2C shows a connecting state of a speaker serving as a load of the amplifier. FIG. 2D shows an operating state of the transistor 2. In the diagrams, the FET 1 is OFF for a period of time until just before a time t1, and the low voltage $V_L$ is equal to the power voltage +B. When the FET 1 is turned on in accordance with an increase in output voltage of the amplifier at the time t1, the supply of the high voltage $V_H$ as a power voltage +B to the amplifier is started. After that, when it is assumed that the speaker is disconnected as shown in FIG. 2C at a time t2, the transistor 2 is turned on. The FET 1 is, consequently, activated as shown in FIG. 2B and the power voltage +B is suppressed to a voltage lower than the maximum voltage (level shown by a broken line in FIG. 2A) which the high voltage $V_H$ can reach. At a time t3 further subsequent to that, the FET 1 is turned off in accordance with a decrease in output voltage of the amplifier, the transistor 2 is turned off, and the low voltage $V_L$ is supplied as a power voltage +B to the amplifier.

Figure 3:
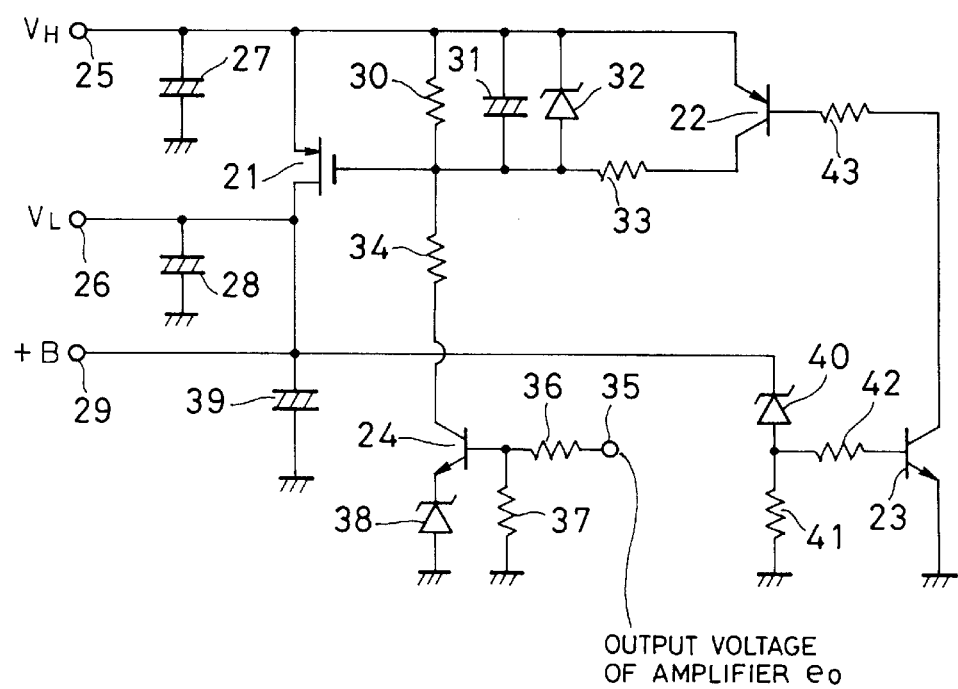
FIG. 3 is a circuit diagram showing another embodiment of the invention.

FIG. 3 shows another embodiment of the invention. An FET 21 and three bipolar transistors 22 to 24 are provided in a voltage supply circuit of the embodiment. The high voltage $V_H$ is supplied to a source S of the FET 21 through an input terminal 25 and the low voltage $V_L$ is supplied to a drain D of the FET 21 through an input terminal 26. Capacitors 27 and 28 are provided between the supplying lines and the ground, respectively. The drain D of the FET 21 is connected to an output terminal 29 of the power voltage +B.

A resistor 30, a capacitor 31, and a Zener diode 32 are connected in parallel between the source and gate of the FET 21. The Zener diode 32 is connected so that its cathode is directed to the source side of the FET 21. The source of the FET 21 is connected to the emitter of the transistor 22 of a pnp type. The gate of the FET 21 is connected to a collector of the transistor 22 through a resistor 33.

The gate of the FET 21 is further connected to a collector of the transistor 24 of an npn type through a resistor 34. The base of the transistor 24 is connected to an input terminal 35 for receiving the output voltage of the amplifier via a resistor 36 and is connected to the ground through a resistor 37. A Zener diode 38 is inserted between the emitter of the transistor 24 and the ground so that a cathode of the diode 38 is connected to the emitter side of the transistor 24.

A connecting line from the input terminal 26 to the output terminal 29 is connected to the ground through a capacitor 39. The connecting line is connected to the ground through a Zener diode 40 and a resistor 41. A connecting point between an anode of the Zener diode 40 and the resistor 41 is connected to the base of the npn type transistor 23 through a resistor 42. A collector of the transistor 23 is connected to the base of the transistor 22 through a resistor 43. The emitter of the transistor 23 is connected to the ground.

In the voltage supply circuit shown in FIG. 3, when the high voltage $V_H$ and low voltage $V_L$ are supplied from a power source circuit (not shown) to the input terminals 25 and 26, the low voltage $V_L$ is outputted as it is from the output terminal 29 to the amplifier as a power voltage +B. The amplifier to which the power voltage +B was supplied executes an amplifying operation to amplify the audio signal. The amplified audio signal is supplied as an output voltage $e_0$ of the amplifier to the input terminal 35 of the voltage supply circuit.

The output voltage $e_0$ of the amplifier supplied to the input terminal 35 is divided by the resistors 36 and 37. When the divided voltage is higher than the total voltage ($V_{D38}+V_{BE24}$) of a Zener voltage $V_{D38}$ of the Zener diode 38 and a voltage $V_{BE24}$ between the base and emitter of the transistor 24, the transistor 24 is turned on. Due to the turn-on of the transistor 24, a current due to the high voltage $V_H$ is supplied to the resistors 30 and 34, between the collector and emitter of the transistor 24, and to the Zener diode 38. The voltage at the connecting point of the resistors 30 and 34, therefore, decreases to a voltage which turns on the FET 21. When the FET 21 is turned on, the high voltage $V_H$ from the power source circuit is generated as a power voltage +B from the output terminal 29 to the amplifier through the portion between the source and drain of the FET 21.

When the output voltage $e_0$ of the amplifier increases, namely, when the divided voltage by the resistors 36 and 37 is higher than the total voltage ($V_{D38}+V_{BE24}$), the transistor 24 is turned on. When the divided voltage is lower than the total voltage ($V_{D38}+V_{BE24}$), the transistor 24 is immediately turned off. Even just after the transistor 24 is turned off from the ON state, the FET 21 continues the ON state because of the charges accumulated in the capacitor 31. When the FET 21 is on, the supply of the power voltage +B that is equal to the high voltage $V_H$ to the amplifier is continued.

When the power voltage +B is equal to the high voltage $V_H$, the high voltage $V_H$ is applied to a serial circuit of the Zener diode 40 and resistor 41. When the level of the power voltage +B exceeds the Zener voltage of the Zener diode 40, a voltage across the Zener diode 40 becomes the Zener voltage, so that the voltage across the resistor 41 changes in accordance with the level of the high voltage $V_H$. When the level of the high voltage $V_H$ as a power voltage +B which is supplied to the amplifier rises due to the operating state of the amplifier because of the disconnection of the speaker or the like, the transistor 23 is turned on by the increase in voltage across the resistor 41. A current is supplied to the base of the transistor 22 due to the turn-on of the transistor 23, thereby turning on the transistor 22.

When the transistor 22 is turned on, the current due to the high voltage $V_H$ is supplied between the emitter and collector of the transistor 22, to the resistors 33 and 34, between the collector and emitter of the transistor 24, and to the Zener diode 38. In this instance, the voltage at the connecting point of the resistors 33 and 34 drops to a value such that the FET 21 is activated. The increase in voltage which is supplied from the gate of the FET 21 to the output terminal 29 is, therefore, suppressed to a voltage lower than the maximum voltage which the high voltage $V_H$ can reach. The suppressed voltage is supplied as a power voltage +B to the amplifier.

When the FET 21 is active, since the level of the power voltage +B is suppressed, the voltage across the resistor 41 drops, so that both of the transistors 23 and 22 are turned off. Since the gate voltage of the FET 21 slightly rises due to the turn-off of the transistor 22, the resistance between the source and drain of the FET 21 decreases, the level of the power voltage +B rises, and the voltage across the resistor 41 also rises. Both of the transistors 23 and 22, therefore, are turned on, so that the transistors 23 and 22 repeat the ON/OFF states when the FET 21 is active.

FIGS. 4A to 4E are diagrams showing the operation of the voltage supply circuit of FIG. 3. FIG. 4A shows the relation between the output voltage $e_0$ of the amplifier and the power voltage +B. FIG. 4B shows the operating state of the FET 21. FIG. 4C shows a connecting state of the speaker serving as a load of the amplifier. FIG. 4D shows operating states of the transistors 22 and 23. FIG. 4E shows the on/off of the transistor 24. In those diagrams, for a period of time until a timing just before the time t1, the FET 21 is off and the low voltage $V_L$ is equal to the power voltage +B. When the transistor 24 is turned on in accordance with an increase in output voltage of the amplifier at the time t1 and the FET 21 is further turned on, the supply of the high voltage $V_H$ to the amplifier as a power voltage +B is started. At the subsequent time t2, the transistor 24 is turned off due to the drop of the output voltage of the amplifier on the positive level side. In this instance, the FET 21 continues the ON state due to the charges accumulated in the capacitor 31. Now, assuming that the speaker is disconnected at the time t3 as shown in FIG. 4C, the circuit enters a switching state in which the transistors 22 and 23 repeat the ON/OFF states. The FET 21, therefore, is activated as shown in FIG. 4B and the power voltage +B is suppressed to a voltage lower than the maximum voltage (level shown by a broken line in FIG. 4A) which the high voltage $V_H$ can reach. At the further subsequent time t4, the transistor 24 is turned off in accordance with the decrease in output voltage of the amplifier. The FET 21 is turned off. The low voltage $V_L$ is supplied as a power voltage +B to the amplifier.

In the voltage supply circuit of FIG. 3, it is sufficient to use the capacitor 31 having an enough small capacity. In this case, the voltage supply circuit operates as shown in each waveform of FIGS. 5A to 5E. That is, in a manner similar to FIGS. 4A to 4E, FIG. 5A shows the relation between the output voltage $e_0$ of the amplifier and the power voltage +B. FIG. 5B shows an operating state of the FET 21. FIG. 5C shows a connecting state of the speaker as a load of the amplifier. FIG. 5D shows operating states of the transistors 22 and 23. FIG. 5E shows a repetition period of time of ON/OFF of the transistor 24. In those diagrams, for a period of time until a timing just before the time t1, the FET 21 is turned off and the low voltage $V_L$ is equal to the power voltage +B. The transistor 24 is first turned on in accordance with an increase in output voltage of the amplifier at the time t1 and the FET 21 is turned on. By the turn-on of the FET 21, the supply of the high voltage $V_H$ to the amplifier as a power voltage +B is started. At the subsequent time t2, since the transistor 24 is turned off due to the reduction of the output voltage of the amplifier on the positive level side, the gate voltage of the FET 21 rises because of a small capacity of the capacitor 31 and the FET 21 is also turned off. The low voltage $V_L$, therefore, is generated as a power voltage +B from the output terminal 29. Since the transistor 24 is again turned on with an increase in output voltage of the amplifier at the time t3 and the FET 21 is turned on, the high voltage $V_H$ is supplied as a power voltage +B to the amplifier. Now, assuming that the speaker is disconnected at the time t4 as shown in FIG. 5C, the apparatus enters the switching state in which the transistors 22 and 23 repeat the ON/OFF states. In the switching states of the transistors 22 and 23, the transistor 24 is turned on in accordance with the increase in output voltage of the amplifier and the FET 21 is further turned on. The FET 21, therefore, also enters a switching state in which the ON/OFF states are repeated as shown in FIG. 5B. When the FET 21 is on, the power voltage +B is suppressed to a voltage lower than the maximum voltage (level shown by a broken line in FIG. 5A) which the high voltage $V_H$ can reach.

The operating states shown in FIGS. 5A to 5E are similar even in the case where the capacitor 31 is not provided in the voltage supply circuit in FIG. 3. In this case, a diode is inserted between the position of the capacitor 28 of the voltage supply circuit in FIG. 3 and the connecting line of the drain of the FET 21.

The signal which is generated from the amplifier is not limited to the signal of the speaker terminal of the amplifier. The audio signal at the input stage of the amplifier can be also supplied to the input terminal 10 or 35 as a signal that is generated from the amplifier.

Although each of the foregoing embodiments has been described with respect to the power voltage +B on the positive side of the amplifier, a power voltage −B on the negative side of the amplifier can be also supplied by a voltage supply circuit similar to that of the above embodiment for receiving a high voltage −$V_H$ and a low voltage −$V_L$.

According to the invention as described above, even if the supplying current to the amplifier fluctuates, increase in supplying voltage can be effectively limited. This eliminates the necessity of using parts of a high withstanding voltage as each part in the amplifier such as a capacitor or the like, so that reduction of costs is enabled.

What is claimed is:

1. A voltage supply circuit for supplying a power voltage to an amplifier, comprising:

means for receiving a high voltage and a low voltage, which are generated from a power source circuit;

switching means for selectively supplying either the high voltage or the low voltage as the power voltage to the amplifier in accordance with a level of a signal generated from the amplifier; and limiting means for limiting the high voltage to a predetermined magnitude or less when the high voltage is selectively supplied to the amplifier, wherein the limiting means limits the high voltage in response to an output voltage of the amplifier.

2. A voltage supply circuit for supplying a power voltage to an amplifier, comprising:

means for receiving a high voltage and a low voltage, which are generated from a power source circuit;

switching means for selectively supplying either the high voltage or the low voltage as the power voltage to the amplifier in accordance with a level of a signal generated from the amplifier, wherein the switching means comprises means for forming an amplification signal voltage according to the level of the signal that is generated from the amplifier; and a field effect transistor having a drain to which the high voltage is supplied, a source to which the low voltage is supplied and which is connected to an output terminal of the power voltage, and a gate to which the amplification signal voltage is supplied, wherein, when the amplification signal voltage is higher than the low voltage, the field effect transistor is turned on and supplies the high voltage from the source to the output terminal of the power voltage; and limiting means for limiting the high voltage to a predetermined magnitude or less when the high voltage is selectively supplied to the amplifier.

3. A voltage supply circuit for supplying a power voltage to an amplifier, comprising:

means for receiving a high voltage and a low voltage, which are generated from a power source circuit;

switching means for selectively supplying either the high voltage or the low voltage as the power voltage to the amplifier in accordance with a level of a signal generated from the amplifier; and limiting means for limiting the high voltage to a predetermined magnitude or less when the high voltage is selectively supplied to the amplifier, wherein the limiting means activates a field effect transistor when an amplification signal voltage exceeds the predetermined magnitude, thereby limiting the high voltage to the predetermined magnitude or less.

4. The voltage supply circuit according to claim 2, wherein the limiting means activates the field effect transistor when the amplification signal voltage exceeds the predetermined magnitude, thereby limiting the high voltage to the predetermined magnitude or less.

5. A voltage supply circuit for supplying a power voltage to an amplifier, comprising:

means for receiving a high voltage and a low voltage, which are generated from a power source circuit;

switching means for selectively supplying either the high voltage or the low voltage as the power voltage to the amplifier in accordance with a level of a signal generated from the amplifier, wherein the switching means comprises means for forming an amplification signal voltage according to the level of the signal that is generated from the amplifier; and a field effect transistor having a source to which the high voltage is supplied, a drain to which the low voltage is supplied and which is connected to an output terminal of the power voltage, and a gate to which the amplification signal voltage is supplied, wherein, when the amplification signal voltage is higher than the low voltage, the field effect transistor is turned on and supplies the high voltage from the drain to the output terminal of the power voltage; and limiting means for limiting the high voltage to a predetermined magnitude or less when the high voltage is selectively supplied to the amplifier.

6. The voltage supply circuit according to claim 1, wherein the switching means comprises means for forming an amplification signal voltage according to the level of the signal that is generated from the amplifier; and a field effect transistor having a drain to which the high voltage is supplied, a source to which the low voltage is supplied and which is connected to an output terminal of the power voltage, and a gate to which the amplification signal voltage is supplied, wherein, when the amplification signal voltage is higher than the low voltage, the field effect transistor is turned on and supplies the high voltage from the source to the output terminal of the power voltage.

7. The voltage supply circuit according to claim 1, wherein the limiting means activates a field effect transistor when an amplification signal voltage exceeds the predetermined magnitude, thereby limiting the high voltage to the predetermined magnitude or less.

8. The voltage supply circuit according to claim 6, wherein the limiting means activates the field effect transistor when the amplification signal voltage exceeds the predetermined magnitude, thereby limiting the high voltage to the predetermined magnitude or less.

9. A voltage supply circuit according to claim 1, wherein the switching means comprises means for forming an amplification signal voltage according to the level of the signal that is generated from the amplifier; and a field effect transistor having a source to which the high voltage is supplied, a drain to which the low voltage is supplied and which is connected to an output terminal of the power voltage, and a gate to which the amplification signal voltage is supplied, wherein, when the amplification signal voltage is higher than the low voltage, the field effect transistor is turned on and supplies the high voltage from the drain to the output terminal of the power voltage.

* * * * *